(12) United States Patent
Gao et al.

(10) Patent No.: US 11,961,424 B2
(45) Date of Patent: Apr. 16, 2024

(54) DISPLAY PANEL AND DISPLAY DEVICE INCLUDING FLEXIBLE SUBSTRATE LAYER WITH INTERSECTING PLANES

(71) Applicant: BOE TECHNOLOGY GROUP CO., LTD., Beijing (CN)

(72) Inventors: Biao Gao, Beijing (CN); Zhao Li, Beijing (CN); Xiaofei Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 198 days.

(21) Appl. No.: 17/482,078

(22) Filed: Sep. 22, 2021

(65) Prior Publication Data

US 2022/0238048 A1 Jul. 28, 2022

(30) Foreign Application Priority Data

Jan. 28, 2021 (CN) .......................... 202110119640.4

(51) Int. Cl.
*H10K 50/84* (2023.01)
*G09F 9/30* (2006.01)
(Continued)

(52) U.S. Cl.
CPC ......... *G09F 9/301* (2013.01); *H10K 50/8426* (2023.02); *H10K 50/844* (2023.02);
(Continued)

(58) Field of Classification Search
CPC ............ H10K 50/8426; H10K 50/844; H10K 50/868; H10K 50/86; H10K 59/87;
(Continued)

(56) References Cited

U.S. PATENT DOCUMENTS 9,690,032 B1 * 6/2017 Nichol ................. G02B 6/0045
9,806,284 B2 * 10/2017 Goto ................. H10K 50/8426
(Continued)

FOREIGN PATENT DOCUMENTS

CN 108877519 A 11/2018
CN 109559639 A 4/2019
(Continued)

OTHER PUBLICATIONS

Chinese Office Action corresponding to CN 202110119640.4; dated Apr. 29, 2022, (19 pages, including English translation).

*Primary Examiner* — Ida M Soward
(74) *Attorney, Agent, or Firm* — Myers Bigel, P.A.

(57) ABSTRACT

A display panel includes a base substrate and a flexible substrate layer. The base substrate includes a flat portion and a curved portion extending from the flat portion and curved towards a side of the base substrate facing away a display surface of the display panel. The flexible substrate layer includes a first portion on a side of the base substrate facing the display surface and a second portion on a side of the base substrate facing away from the display surface. The first
(Continued)

portion includes a pixel circuit and the second portion includes a signal line electrically connected to the pixel circuit. The display panel further includes a support structure including a support surface facing away from the display surface, the second portion is coupled to the support surface, and a plane of the support surface intersects a plane of the flat portion of the base substrate.

18 Claims, 6 Drawing Sheets

(51) Int. Cl.
| | |
|---|---|
| H10K 50/80 | (2023.01) |
| H10K 50/842 | (2023.01) |
| H10K 50/844 | (2023.01) |
| H10K 50/86 | (2023.01) |
| H10K 59/40 | (2023.01) |
| H10K 77/10 | (2023.01) |
| G02F 1/1333 | (2006.01) |
| G06F 1/16 | (2006.01) |
| H10K 102/00 | (2023.01) |

(52) U.S. Cl.
CPC ......... H10K 50/868 (2023.02); H10K 77/111 (2023.02); *G02F 1/133305* (2013.01); *G02F 1/133331* (2021.01); *G06F 1/1641* (2013.01); *G06F 1/1652* (2013.01); *G09G 2380/02* (2013.01); *H10K 59/40* (2023.02); *H10K 2102/311* (2023.02)

(58) Field of Classification Search
CPC ............... H10K 59/40; H10K 77/111; H10K 2102/311; G02F 1/133305; G02F 1/13331; G06F 1/1641; G06F 1/1652; G09F 9/301; G09F 9/33; G09G 2380/02
See application file for complete search history.

(56) References Cited

U.S. PATENT DOCUMENTS

| | | | | |
|---|---|---|---|---|
| 10,229,963 | B1* | 3/2019 | Qi | H10K 59/131 |
| 10,496,136 | B2* | 12/2019 | Kim | G06F 1/1637 |
| 10,816,836 | B2* | 10/2020 | Cheng | H10K 50/844 |
| 10,903,445 | B2* | 1/2021 | Baek | H10K 50/84 |
| 11,195,448 | B2* | 12/2021 | He | G06F 1/1632 |
| 11,222,934 | B2* | 1/2022 | Kim | H01L 33/44 |
| 2014/0217382 | A1* | 8/2014 | Kwon | H10K 77/111 |
| | | | | 257/40 |
| 2016/0293869 | A1* | 10/2016 | Saeki | H05K 999/99 |
| 2016/0295176 | A1* | 10/2016 | Jeong | G06F 1/1637 |
| 2016/0380229 | A1* | 12/2016 | Ando | H10K 50/8426 |
| | | | | 257/88 |
| 2017/0285243 | A1* | 10/2017 | Nichol | G02B 6/0045 |
| 2017/0338294 | A1* | 11/2017 | Choi | H10K 59/87 |
| 2020/0310577 | A1* | 10/2020 | Jeon | H10K 50/844 |
| 2020/0342790 | A1 | 10/2020 | Xie | |
| 2021/0104582 | A1* | 4/2021 | Kim | H04M 1/0269 |
| 2022/0129106 | A1* | 4/2022 | Kim | G06F 3/0446 |

FOREIGN PATENT DOCUMENTS

| | | | | |
|---|---|---|---|---|
| CN | 110764302 A | * | 2/2020 | ............ H10K 59/12 |
| CN | 111128020 A | * | 5/2020 | ............ G09F 9/301 |
| CN | 111128020 A | | 5/2020 | |
| CN | 111179756 A | | 5/2020 | |
| CN | 210836910 U | * | 6/2020 | ........... G06F 3/0412 |
| CN | 112086495 A | * | 12/2020 | ............ G09F 9/301 |
| CN | 112116879 A | | 12/2020 | |
| KR | 20200111508 A | * | 1/2020 | ............ G09F 9/301 |

* cited by examiner

DISPLAY PANEL AND DISPLAY DEVICE INCLUDING FLEXIBLE SUBSTRATE LAYER WITH INTERSECTING PLANES

CROSS REFERENCE TO RELATED APPLICATIONS

The application claims the priority benefits of the patent application No. 202110119640.4 filed with the Patent Office of China on Jan. 28, 2021, the disclosure of which is incorporated herein by reference.

TECHNICAL FIELD

The present application relates to the field of display technologies, especially to a display panel and a display device.

BACKGROUND

With the development of display technologies, flexible display modules have become more and more widely used. For example, due to the advantages of OLED flexible display elements, display devices with a full screen, a narrow bezel and a curved screen have a lot of room for development. The process of fabricating a typical OLED flexible display panel includes depositing a barrier layer, an insulating layer, a gate array control switch elements, a metal electrode, and the like on a flexible substrate, and then evaporating a light emitting material on the surface of a pixel circuit. In order to realize a narrow bezel, the edge of a flexible display panel is usually designed to be a curved edge with a certain curvature, which involves a process of bending an edge region of a flexible substrate layer including the pixel circuit. However, in a fabricated flexible display panel, damage to the wiring in the flexible substrate layer often occurs, which affects the yield of the flexible display panel.

SUMMARY

An embodiment of the present disclosure provides a display panel comprising a base substrate and a flexible substrate layer on the base substrate. The base substrate comprises a flat portion and a curved portion extending from the flat portion and curved towards a side of the base substrate facing away from a display surface of the display panel, and the flexible substrate layer comprises a first portion on a side of the base substrate facing the display surface of the display panel and a second portion on a side of the base substrate facing away from the display surface. The first portion of the flexible substrate layer comprises a pixel circuit for driving pixels of the display panel, and the second portion of the flexible substrate layer comprises a signal line electrically connected to the pixel circuit. The display panel further comprises a support structure fixed to the curved portion of the base substrate, the support structure comprises a support surface facing away from the display surface of the display panel, the second portion of the flexible substrate layer is coupled to the support surface to be supported by the support surface, and a plane of the support surface intersects a plane of the flat portion of the base substrate.

According to some embodiments of the disclosure, the support structure comprises a support adhesive layer, the support adhesive layer is fixed to a surface of the curved portion of the base substrate facing away from the display surface of the display panel, a flat surface of the support adhesive layer facing away from the display surface of the display panel forms the support surface, the display panel further comprises a first protective layer between the support surface and the second portion of the flexible substrate layer.

According to some embodiments of the disclosure, the support adhesive layer extends to the flat portion of the base substrate and comes into contact with a portion of a surface of the flat portion facing away from the display surface of the display panel.

According to some embodiments of the disclosure, the display panel further comprises a second protective layer on a surface of the second portion of the flexible substrate layer facing away from the support adhesive layer.

According to some embodiments of the disclosure, a material of the support adhesive layer comprises foamed rubber.

According to some embodiments of the disclosure, a thickness and a modulus of the first protective layer are respectively equal to a thickness and a modulus of the second protective layer.

According to some embodiments of the disclosure, the base substrate further comprises a reversely bent portion extending from the curved portion and bending towards the flat portion of the base substrate, the reversely bent portion forms the support structure, and an end of the reversely bent portion is in contact with a surface of one of the flat portion and the curved portion of the base substrate facing away from the display surface of the display panel.

According to some embodiments of the disclosure, the display panel further comprises a first adhesive layer and a first protective layer between the second portion of the flexible substrate layer and the reversely bent portion, and the second portion of the flexible substrate layer and the first protective layer are fixed to the reversely bent portion via the first adhesive layer.

According to some embodiments of the disclosure, the display panel further comprises a second protective layer on a surface of the second portion of the flexible substrate layer facing away from the reversely bent portion.

According to some embodiments of the disclosure, the first portion of the flexible substrate layer extends along the flat portion and the curved portion of the base substrate, the flexible substrate layer further reversely bends and extends from the first portion toward the flat portion of the base substrate beyond the curved portion of the base substrate, thereby forming the second portion and an arc-shaped portion connecting the second portion and the first portion, the display panel further comprises a third protective layer on a surface of the arc-shaped portion facing away from the base substrate.

According to some embodiments of the disclosure, the display panel further comprises a fourth protective layer between the base substrate and the flexible substrate layer, the fourth protective layer extends along the flat portion and the curved portion of the base substrate without going beyond an end of the curved portion of the base substrate.

According to some embodiments of the disclosure, the display panel further comprises a light emitting layer, a polarizing layer and a cover plate on a side of the flexible substrate layer facing away from the base substrate.

Another embodiment of the disclosure provides a display device comprising the display panel according to any one of the foregoing embodiments.

BRIEF DESCRIPTION OF THE DRAWINGS

By referring to the detailed description of non-limiting embodiments with reference to the following drawings, other features, purposes and advantages of the application will become more apparent.

DETAILED DESCRIPTION OF EMBODIMENTS

Figure 1:
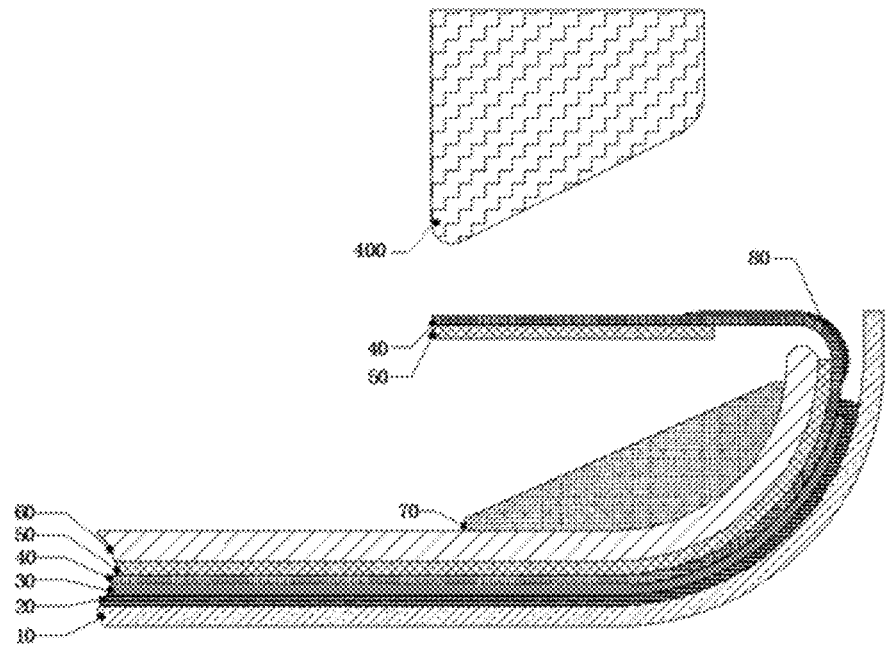
FIG. 1 illustrates a partial sectional view of a display panel according to an embodiment of the disclosure, in which the second portion of the flexible substrate layer is in an unbent state.

Embodiments of the present disclosure will be further described in detail below with reference to the accompanying drawings and examples. It can be understood that specific embodiments described herein are only for explaining the present disclosure, rather than to limit the protection scope of the present application. In addition, it is to be further noted that, to facilitate description, only the components and elements related to the technical solutions of the embodiments of the disclosure are shown in the drawings.

The terms such as "first", "second" and similar words in the application do not indicate any order, quantity or importance, but are only used to distinguish different elements or portions. The wording such as "include" or "comprise" means that an element before the wording covers elements listed after the wording, which does not exclude the possibility of covering other elements as well. "Upper", "lower", "left", "right", "inner", "outer", "top", "bottom", etc. are only used to indicate a relative positional relationship. When the absolute position of an object is changed, the relative positional relationship may be changed accordingly.

A display panel according to an embodiment of the disclosure comprises a base substrate and a flexible substrate layer on the base substrate. The base substrate comprises a flat portion and a curved portion extending from the flat portion and curved towards a side of the base substrate facing away from a display surface of the display panel. The flexible substrate layer comprises a first portion on a side of the base substrate facing the display surface of the display panel and a second portion on a side of the base substrate facing away from the display surface. The first portion of the flexible substrate layer comprises a pixel circuit for driving pixels of the display panel, and the second portion of the flexible substrate comprises a signal line electrically connected to the pixel circuit. The display panel further comprises a support structure fixed to the curved portion of the base substrate. The support structure comprises a support surface facing away from the display surface of the display panel, and the second portion of the flexible substrate layer is coupled to the support surface to be supported by the support surface, and a plane of the support surface intersects a plane of the flat portion of the base substrate.

Figure 2A:
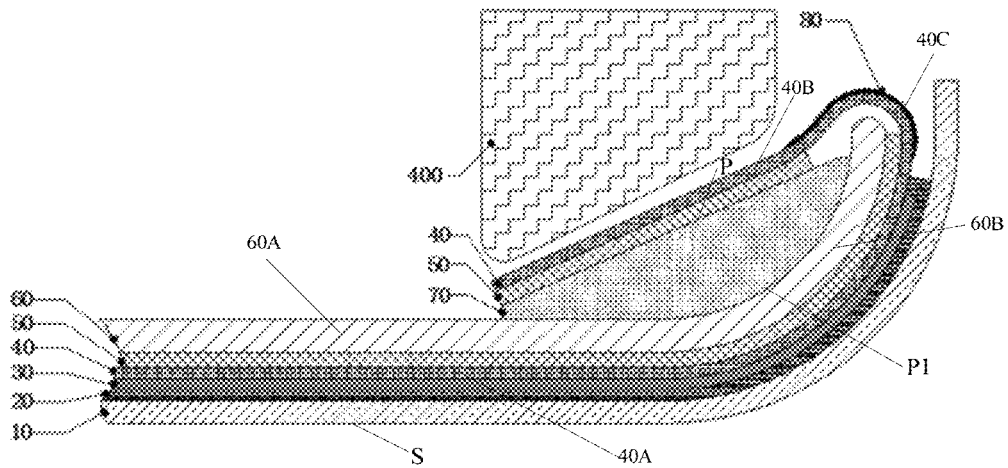
FIG. 2a illustrates a state where the second portion of the flexible substrate layer in the display panel shown in FIG. 1 is bent.
Figure 2B:
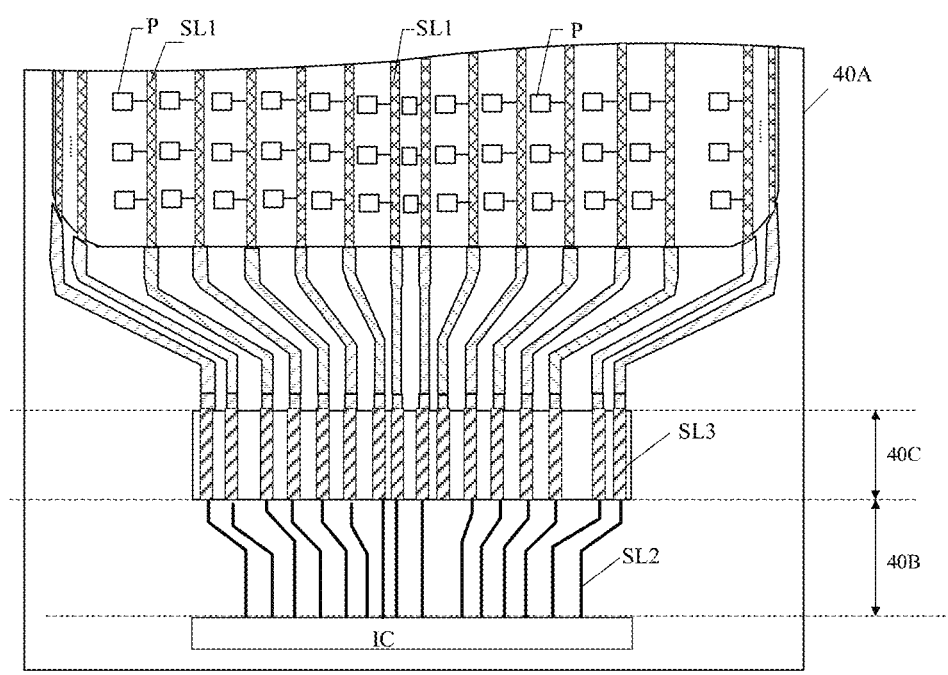
FIG. 2b illustrates a partial structural view of the flexible substrate layer in an unbent state according to an embodiment of the disclosure.

The specific form of the support surface of the support structure is not limited herein. The support surface may be a flat surface or a curved surface, and the support surface may be a rough surface or a smooth surface. In the case where the support surface is a curved surface, the radius of curvature of the support surface may be greater than the radius of curvature of the curved portion of the base substrate. During the process of fabricating the display panel provided by the embodiment of the disclosure, especially in the process of fabricating a curved portion of the display panel (e.g., the curved portion of the flexible substrate layer, that is, the second portion described above), the second portion of the flexible substrate layer will be subjected to the pressure from the indenter of an external mechanical apparatus, and the support structure with the support surface can provide supporting force for the second portion of the flexible substrate layer to buffer the pressure of the indenter of the mechanical apparatus on the second portion of the flexible substrate layer and reduce the risk of breakage and failure of the signal line in the flexible substrate layer, thereby improving the reliability of the fabricated display panel. In addition, the second portion 40B of the flexible substrate layer may be connected to an integrated circuit chip, for example, a source driver chip IC, so that the signal line SL2 in the second portion 40B can perform signal transmission with the source driver IC to achieve image display, as illustrated in FIG. 2b discussed below.

The display panel provided by the embodiment will be further illustrated below by way of examples. FIGS. 2, 4, 6 and 8 illustrate partial sectional views of display panels in a bent state according to different examples, and FIGS. 1, 3, 5 and 7 illustrate the states of display panels to which the display panels shown in FIGS. 2, 4, 6 and 8 correspond respectively prior to being subjected to the pressure of the indenter of an external mechanical apparatus. As shown in FIGS. 1 and 2, the display panel comprises a base substrate 60 and a flexible substrate layer 40 on the base substrate 60. The base substrate 60 includes a flat portion 60A and a curved portion 60B extending from the flat portion 60A and curved towards a side of the base substrate 60 facing away from a display surface S of the display panel. The flexible substrate layer 40 comprises a first portion 40A on a side of the base substrate 60 facing the display surface S of the display panel and a second portion 40B on a side of the base substrate 60 facing away from the display surface S. The first portion 40A of the flexible substrate layer 40 comprises a pixel circuit P (as shown in FIG. 2b) for driving pixels of the display panel, and the second portion 40B of the flexible substrate layer comprises a signal line SL2 (as shown in FIG. 2b) electrically connected to the pixel circuit P. A support structure fixed to the curved portion 60B of the base substrate 60 comprises a support adhesive layer 70 comprising a support surface P facing away from the display surface S of the display panel, and the second portion 40B of the flexible substrate layer 40 is coupled to the support surface P to be supported by the support surface P, and the plane of the support surface P intersects and the plane of the flat portion 60A of the base substrate 60. FIG. 2b illustrates a partial structural view of the flexible substrate layer in an unbent state according to an embodiment of the disclosure. As shown in FIG. 2b, the flexible substrate layer 40 includes a first portion 40A, a second portion 40B and a third portion 40C. The flexible substrate layer 40 can be bent at the third portion 40C, which then would be formed as the arc-shaped portion 40C described below. The first portion 40A comprises pixel circuits P and signal lines SL1 electrically connected with respective pixel circuits P. The second portion 40B comprises signal lines SL2 electrically connected with respective pixel circuits P. The third portion 40C includes signal lines SL3 connected with the signal lines SL1 and SL2.

The bending process performed for the display panel will be briefly described below with reference to FIGS. 1 and 2. As shown in FIG. 1, before the flexible substrate layer 40 of the display panel is subjected to the bending process, the second portion 40B of the flexible substrate layer 40 may be in a horizontal state. An indenter 400 of an external apparatus moves downwards from a position above the second portion 40B of the flexible substrate layer 40 and then comes into contact with the second portion 40B of the flexible substrate layer 40. The second portion 40B of the flexible substrate layer 40 bends under the pressure of the indenter 400, gradually approaches the support adhesive layer 70, and is bonded and fixed to the support adhesive layer 70 (other protective structures may be provided between the second portion 40B and the support adhesive layer 70, for example, a protective layer 50 to be described below). As the indenter 400 continues to apply pressure, the support adhesive layer 70 achieves a tight connection with the flexible substrate layer 40 during the process of providing a reaction force to the second portion 40B of the flexible substrate layer 40, as shown in FIG. 2a. In this embodiment, during the process of performing the bending process for the display panel with the indenter 400, the surface of the indenter 400 facing the display panel may be kept parallel to the support surface P of the support adhesive layer 70.

In the example of FIG. 2a, the support adhesive layer 70 is fixed to a surface P1 of the curved portion 60B of the base substrate 60 facing away from the display surface S of the display panel, and a flat surface of the support adhesive layer 70 facing away from the display surface S of the display panel forms the support surface P. That is, in this embodiment, the support surface P is a flat surface. The display panel further comprises a first protective layer 50 between the support surface P and the second portion 40B of the flexible substrate layer. As shown in FIG. 1, the first protective layer 50 may be pre-formed on the second portion 40B of the flexible substrate layer 40. In this way, during the process of performing the bending process for the flexible substrate layer 40 with the indenter 400 of an external mechanical apparatus, the first protective layer 50 can provide additional protection for signal lines SL2 or other devices in the second portion 40B of the flexible substrate layer 40. According to some embodiments of the disclosure, the material of the support adhesive layer 70 includes a foamed rubber, and the material of the first protective layer 50 may include polyimide.

Figure 4:
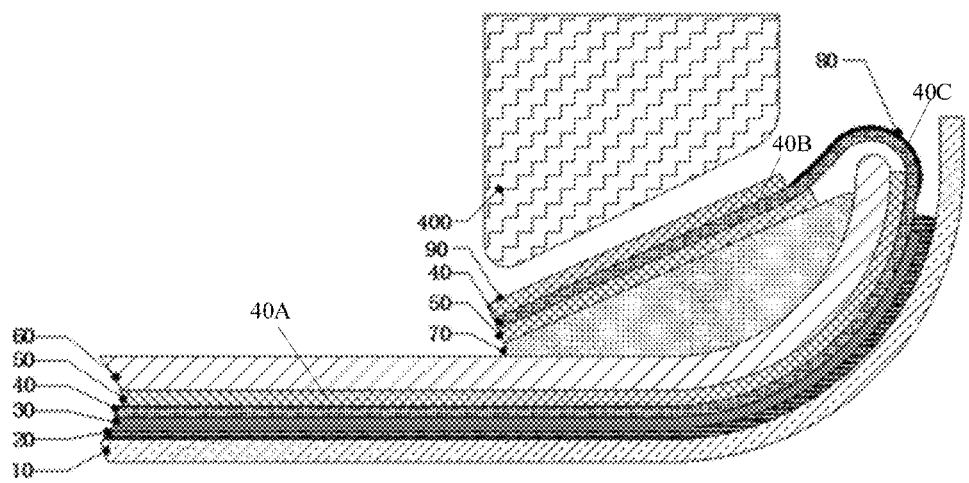
FIG. 4 illustrates a state where the second portion of the flexible substrate layer in the display panel shown in FIG. 3 is bent.
Figure 5:
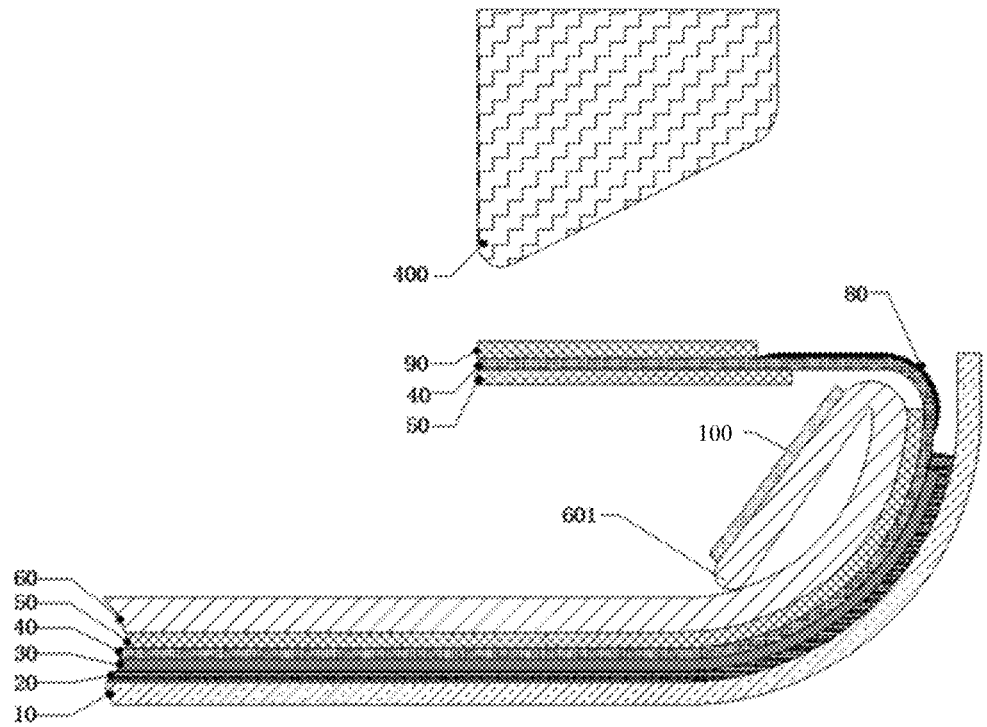
FIG. 5 illustrates a partial sectional view of a display panel according to another embodiment of the disclosure, in which the second portion of the flexible substrate layer is in an unbent state.

In the examples of FIGS. 2 and 4, the support adhesive layer 70 is directly fixed to a surface of the curved portion of the base substrate, and the support adhesive layer 70 directly acts as a support structure, thereby eliminating the necessity of arranging an auxiliary support device. The base substrate 60 may be made of a rigid material. For example, the base substrate may include a metal material such as stainless steel. Compared to the base substrate, the support adhesive layer 70 may have some elasticity. In this way, the support adhesive layer 70 is supported by the rigid base substrate 60, which can decrease a required thickness of the support adhesive layer 70 to thereby reduce the amount of deformation of the support adhesive layer 70 when subjected to an external force, and can provide support for the second portion 40B of the flexible substrate layer 40 during the process of performing the bending process for the display panel, further reducing the risk of damage to signal lines SL2 in the second portion 40B of the flexible substrate layer 40 during the bending process.

As shown in FIGS. 1 to 4, according to some embodiments of the disclosure, the support adhesive layer 70 extends to the flat portion 60A of the base substrate 60 and comes into contact with a portion of the surface of the flat portion 60A facing away from the display surface S of the display panel. Thus, the support adhesive layer 70 is simultaneously fixed to the flat portion 60A and the curved portion 60B of the base substrate, which enhances the reliability and stability of the support adhesive layer 70.

Figure 3:
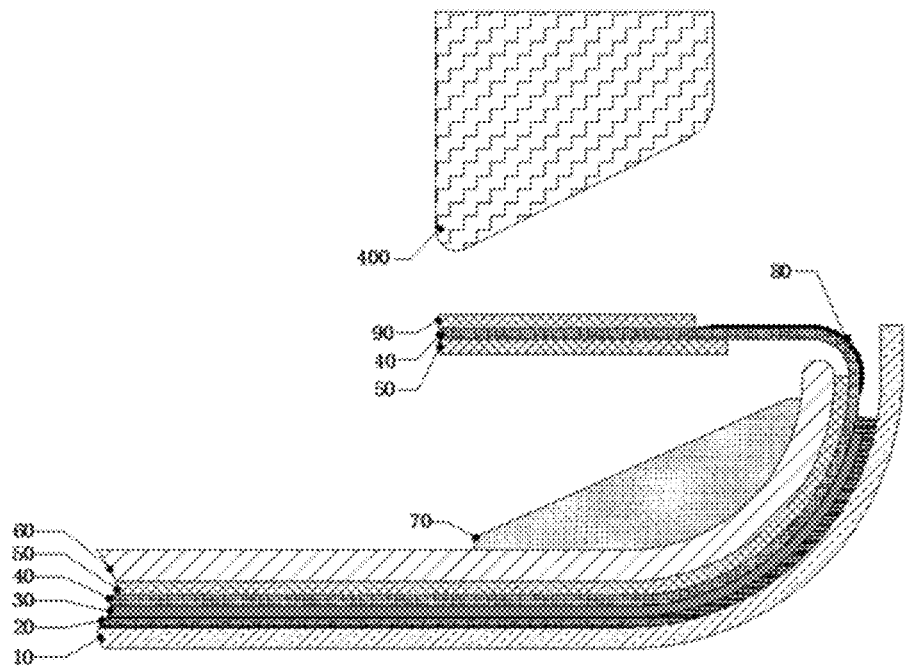
FIG. 3 illustrates a partial sectional view of a display panel according to another embodiment of the disclosure, in which the second portion of the flexible substrate layer is in an unbent state.

As shown in FIG. 4, in some embodiments, the display panel further comprises a second protective layer 90 on a surface of the second portion 40B of the flexible substrate layer 40 facing away from the support adhesive layer 70. The second protective layer 90 may include polyimide, which may be pre-formed on the second portion 40B of the flexible substrate layer 40, as shown in FIG. 3. With the second protective layer 90, the second portion of the flexible substrate layer 40 is able to serve as a stress-neutral layer. When the bending process is performed for the flexible substrate layer 40 with the indenter 400, it is possible to buffer the pressure received by the second portion 40B of the flexible substrate layer 40, and meanwhile prevent the indenter 400 from causing damage to the second portion 40B of the flexible substrate layer 40.

As shown in FIGS. 3 and 4, the thickness and modulus of the first protective layer 50 are equal to those of the second protective layer 90, respectively. The first protective layer 50 and the second protective layer 90 both include polyimide. In some embodiments, the first protective layer and the second protective layer both have a thickness of 50 µm±25 µm and a modulus of about 3.5±1 GPa. In this way, the two opposite surfaces of the second portion 40B of the flexible substrate layer 40 are covered with a protective layer of the same material and the same thickness, which can be better protected during the bending process of the display panel.

Figure 6:
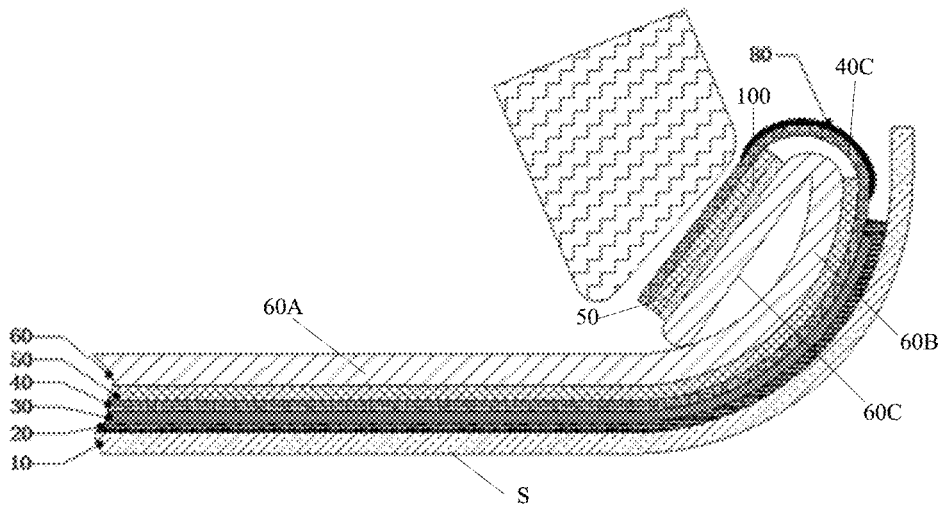
FIG. 6 illustrates a state where the second portion of the flexible substrate layer in the display panel shown in FIG. 5 is bent.
Figure 7:
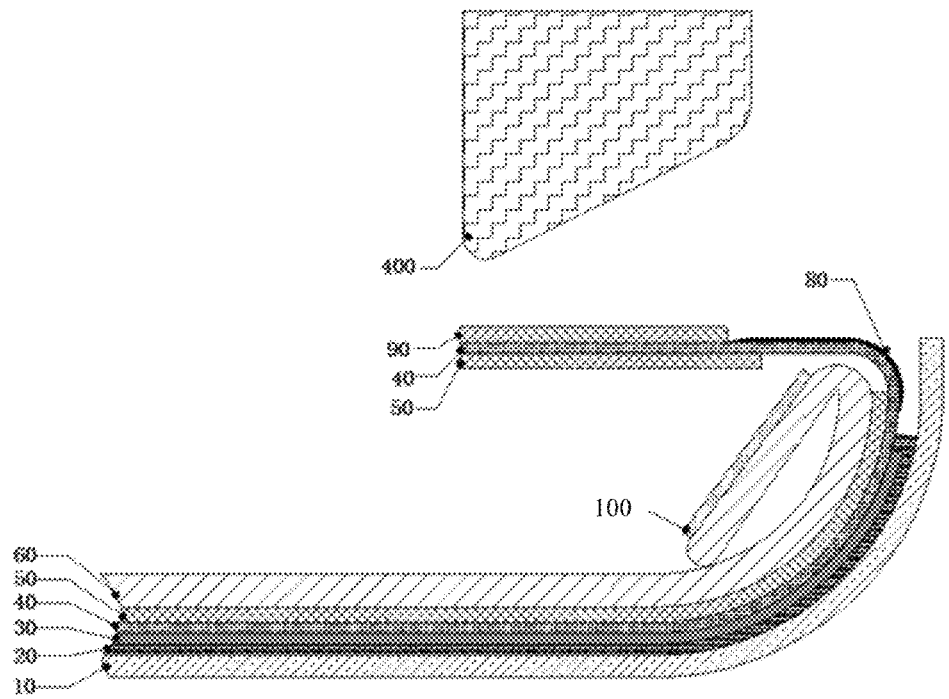
FIG. 7 illustrates a partial sectional view of a display panel according to another embodiment of the disclosure, in which the second portion of the flexible substrate layer is in an unbent state.
Figure 8:
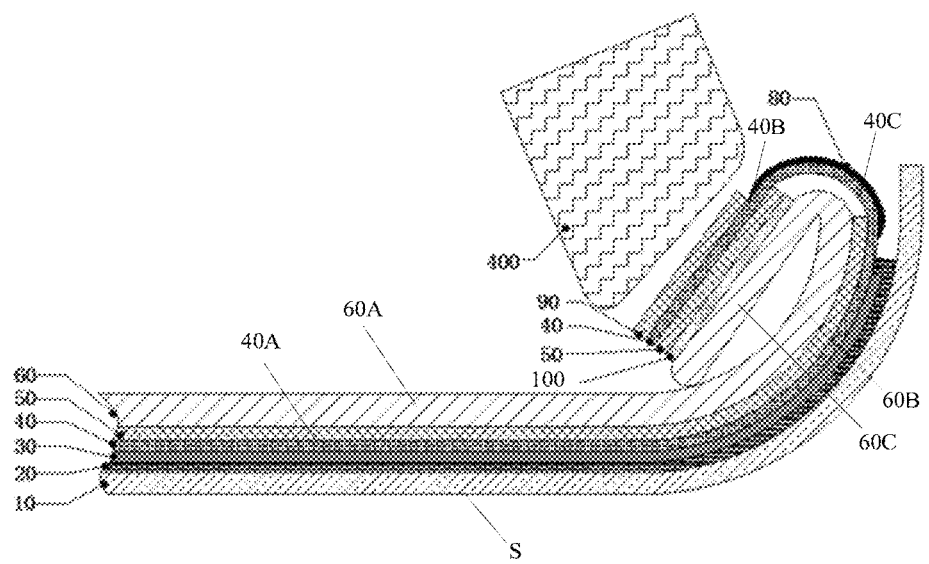
FIG. 8 illustrates a state where the second portion of the flexible substrate layer in the display panel shown in FIG. 7 is bent.

According to some embodiments of the disclosure, as shown in FIG. 6 or FIG. 8, the base substrate 60 further comprises a reversely bent portion 60C extending from the curved portion 60B and bending towards the flat portion 60A of the base substrate 60. The reversely bent portion 60C forms the support structure, and an end of the reversely bent portion 60C is in contact with the surface of one of the flat portion 60A and the curved portion 60B of the base substrate 60 that faces away from the display surface S of the display panel. In the example of FIGS. 6 and 8, the end of the reversely bent portion 60C is in contact with the surface of the curved portion 60B of the base substrate 60 that faces away from the display surface S of the display panel. In another embodiment, the reversely bent portion 60C may extend to the flat portion of the base substrate 60, so that the end of the bent portion 60C is in contact with the surface of the flat portion of the base substrate that faces away from the display surface S of the display panel. In this embodiment, the surface of the reversely bent portion 60C facing away from the display surface S of the display panel is namely the support surface of the support structure described above. In this embodiment, the reversely bent portion 60C is easy to provide a flat support surface, which can provide a uniform support force for the second portion 40B of the flexible substrate layer 40, and further reduce the risk of damage to signal lines in the second portion 40B of the flexible substrate layer 40 during the bending process. Moreover, the end of the reversely bent portion 60C abuts against the surface of the base substrate facing away from the display surface of the display panel. In the bending process for the display panel, when an external indenter applies pressure to the display panel, the reversely bent portion 60C will maintain a stable state without moving relative to the flat portion 60A or the curved portion 60B, so as to prevent damage to signal lines in the second portion 40B of the flexible substrate layer 40 resulting from unstable forces received by its different parts during the pressurizing process.

As shown in FIG. 6 or 8, in some embodiments, the display panel further comprises a first adhesive layer 100 and a first protective layer 50 between the second portion 40B of the flexible substrate layer 40 and the reversely bent portion 60C, and the second portion 40 of the flexible substrate layer and the first protective layer 50 are fixed to the reversely bent portion 60C via the first adhesive layer 100. The first adhesive layer 100 here may include the same material as the support adhesive layer 70 described above. Further, as shown in FIG. 8, the display panel further comprises a second protective layer 90 on a surface of the second portion 40B of the flexible substrate layer 40 facing away from the reversely bent portion 60C.

According to some embodiments of the disclosure, as shown in FIGS. 2, 4, 6 and 8, the first portion 40A of the flexible substrate layer extends along the flat portion 60A and the curved portion 60B of the base substrate 60, and the flexible substrate layer 40 further reversely bends and extends from the first portion 40A towards the flat portion 60A of the base substrate 60 beyond the curved portion 60B of the base substrate, thereby forming the second portion 40B and an arc-shaped portion 40C connecting the second portion 40B and the first portion 40A. The display panel further comprises a third protective layer 80 on a surface of the arc-shaped portion 40C facing away from the base substrate 60. The third protective layer 80 may include an ultraviolet curing glue. The third protective layer 80 can provide good protection for signal lines (signal lines SL3 shown in FIG. 2b) in the arc-shaped portion 40C during the bending process for the display panel.

Further, as shown in FIGS. 2, 4, 6 and 8, the display panel further comprises a fourth protective layer 50' between the base substrate 60 and the flexible substrate layer 40, and the fourth protective layer 50' extends along the flat portion 60A and the curved portion 60B of the base substrate without going beyond the end of the curved portion 60B of the base substrate. The fourth protective layer 50' and the first protective layer 50 described above may be formed of the same material. In some embodiments, the fourth protective layer 50' and the first protective layer 50 may be formed in the same patterning process, that is, the fourth protective layer 50' and the first protective layer 50 form a protective pattern, and the protective pattern includes an opening corresponding to the arc-shaped portion 40C of the flexible substrate layer 40. As such, this can facilitate the bending process for the flexible substrate layer 40, and meanwhile provide comprehensive protection for the flexible substrate layer 40.

As shown in FIGS. 1 to 8, in some embodiments, the display panel further comprises a light emitting layer 30, a polarizing layer 20 and a cover plate 10 on a side of the flexible substrate layer 40 facing away from the base substrate 60. In the examples of FIGS. 1 to 8, when the display panel is operating to display images, the viewing surface of the display panel on which a user views the displayed images is a surface of the cover plate 10 facing away from the base substrate 60, and this surface acts as the display surface S of the display panel. The cover plate 10 may include glass, i.e., the cover plate 10 may be a glass cover plate. In some embodiments, the light emitting layer 30 may comprise a touch structure, for example, the light emitting layer 30 is an OLED touch display layer.

Figure 10:
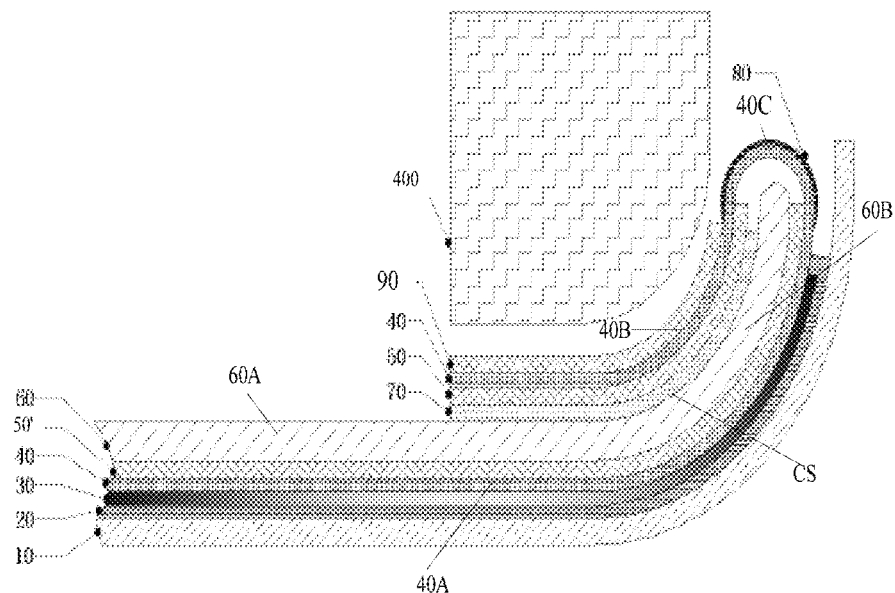
FIG. 10 illustrates a state where the second portion of the flexible substrate layer in the display panel shown in FIG. 9 is bent.

According to another embodiment of the application, as shown in FIG. 10, the display panel comprises a base substrate 60 and a flexible substrate layer 40 on the base substrate 60. The base substrate 60 comprises a flat portion 60A and a curved portion 60B extending from the flat portion 60A and curved towards a side of the base substrate 60 facing away from the display surface S of the display panel. The flexible substrate layer 40 comprises a first portion 40A on a side of the base substrate 60 facing the display surface S of the display panel and a second portion 40B on a side of the base substrate 60 facing away from the display surface S. The first portion 40A of the flexible substrate layer 40 comprises a pixel circuit (not shown) for driving pixels of the display panel, and the second portion 40B of the flexible substrate comprises a signal line SL2 electrically connected to the pixel circuit. The second portion 40B of the flexible substrate layer 40 bends and extends along a curved surface CS of the curved portion 60B of the base substrate facing away from the display surface, and the second portion 40B is coupled to the curved surface CS of the curved portion 60B to be supported by the curved portion 60B. The display panel further comprises a second protective layer 90 on a surface of the second portion 40B facing away from the curved portion 60B.

Figure 9:
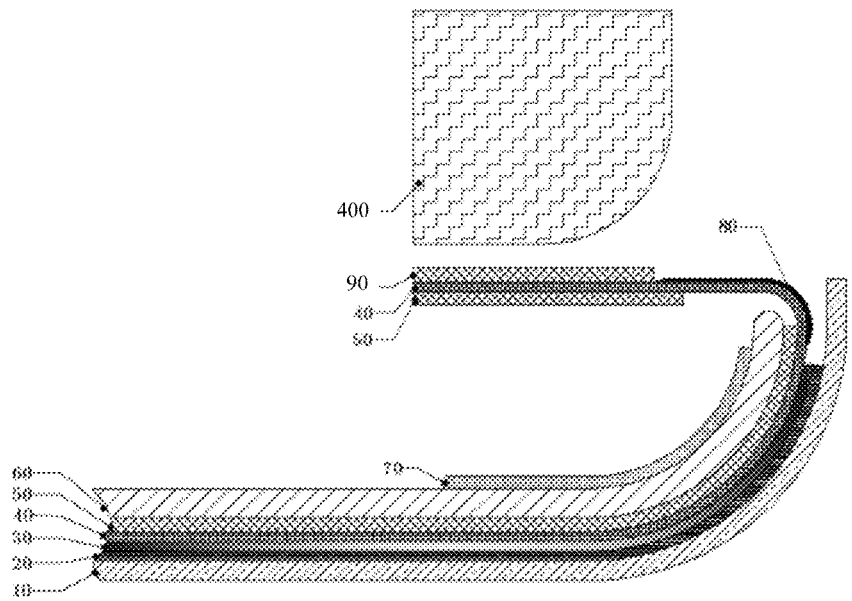
FIG. 9 illustrates a partial sectional view of a display panel according to yet another embodiment of the disclosure, in which the second portion of the flexible substrate layer is in an unbent state.

In some embodiments, the second protective layer 90 may include polyimide, which may be pre-formed on the second portion 40B of the flexible substrate layer 40, as shown in FIG. 9. By disposing the second protective layer 90, the second portion of the flexible substrate layer 40 is able to be a stress-neutral layer. When the bending process is performed for the flexible substrate layer 40 with the indenter 400, it is possible to buffer the pressure received by the second portion 40B of the flexible substrate layer 40, and meanwhile prevent the indenter 400 from causing damage to the second portion 40B of the flexible substrate layer 40. In addition, during the process of applying the bending process on the display panel, in this embodiment, the second protective layer 90 may be bent along with the second portion 40B of the flexible substrate layer, so that the second protective layer 90 forms a curved structure. The second protective layer 90, the second portion 40B of the flexible substrate layer, and the curved portion 60B of the base substrate may have the same curvature.

As shown in FIG. 10, in some embodiments, the display panel further comprises a first protective layer 50 and a support adhesive layer 70 between the second portion 40B of the flexible substrate layer and the curved surface CS of the base substrate 60. The second portion 40B of the flexible substrate layer and the first protective layer 50 are fixed to the curved surface CS of the curved portion via the support adhesive layer 70. The support adhesive layer 70, the first protective layer 50, the second portion, and the curved portion of the base substrate have a same curvature. Therefore, in this embodiment, the curved portion 60B of the base substrate, the support adhesive layer 70, the first protective layer 50, and the second portion 40B of the flexible substrate layer form multilayer curved structures stacked in sequence, and these is no gap between different layers of the multilayer curved structures.

As shown in FIG. 10, the first portion 40A of the flexible substrate layer 40 extends along the flat portion 60A and the curved portion 60B of the base substrate 60, and the flexible substrate layer 40 further reversely bends and extends from the first portion 40A toward the flat portion 60A of the base substrate beyond the curved portion 60B of the base substrate, thereby forming the second portion 40B and an arc-shaped portion 40C connecting the second portion 40B and the first portion 40A. The display panel further comprises a third protective layer 80 on a surface of the arc-shaped portion 40C facing away from the base substrate 60. The third protective layer 80 may include ultraviolet curing glue. The third protective layer 80 can provide good protection for signal lines SL3 in the arc-shaped portion 40C during the bending process for the display panel.

Further, as shown in FIG. 10, similar to the foregoing embodiment, the display panel further comprises a fourth protective layer 50' between the base substrate 60 and the flexible substrate layer 40, and the fourth protective layer 50' extends along the flat portion 60A and the curved portion 60B of the base substrate without going beyond the end of the curved portion 60B of the base substrate. The fourth protective layer 50' and the first protective layer 50 are formed of the same material. Furthermore, the display panel further comprises a light emitting layer 30, a polarizing layer 20 and a cover plate 10 on a side of the flexible substrate layer 40 facing away from the base substrate 60.

Another embodiment of the disclosure provides a display device comprising the display panel described in any one of the foregoing embodiments. The display device may be any electronic device having a display function, including but not limited to a mobile phone, a tablet computer, a watch, a navigation apparatus, and the like.

What have been described are only some embodiments of the disclosure and explanations of the related technical principles. Those skilled in the art should understand that the scope involved in the disclosure is not limited to technical solutions formed by specific combinations of the described technical features, and should also encompass other technical solutions formed by any combinations of the described technical features or their equivalent features without departing from the inventive concept, for example, technical solutions formed by replacing the above features and technical features having similar functions as those disclosed in the present disclosure (but not limited to) with each other.

The invention claimed is:

1. A display panel, comprising:
a base substrate; and
a flexible substrate layer on the base substrate,
wherein the base substrate comprises a flat portion and a curved portion extending from the flat portion and curved towards a side of the base substrate facing away from a display surface of the display panel, and the flexible substrate layer comprises a first portion on a side of the base substrate facing the display surface of the display panel and a second portion on a side of the base substrate facing away from the display surface,
wherein the first portion of the flexible substrate layer comprises a pixel circuit for driving pixels of the display panel, and the second portion of the flexible substrate layer comprises a signal line electrically connected to the pixel circuit,
wherein the display panel further comprises a support structure fixed to the curved portion of the base substrate, the support structure comprises a support surface facing away from the display surface of the display panel, the second portion of the flexible substrate layer is coupled to the support surface to be supported by the support surface, and a plane of the support surface intersects a plane of the flat portion of the base substrate,
wherein the support structure comprises a support adhesive layer, the support adhesive layer is fixed to a surface of the curved portion of the base substrate facing away from the display surface of the display panel, a flat surface of the support adhesive layer facing away from the display surface of the display panel forms the support surface, wherein the display panel further comprises a first protective layer between the support surface and the second portion of the flexible substrate layer, and
wherein the display panel further comprises a second protective layer on a surface of the second portion of the flexible substrate layer facing away from the support adhesive layer.

2. The display panel according to claim 1, wherein the support adhesive layer extends to the flat portion of the base substrate and is in contact with a portion of a surface of the flat portion facing away from the display surface of the display panel.

3. The display panel according to claim 1, wherein a material of the support adhesive layer comprises foamed rubber.

4. The display panel according to claim 1, wherein a thickness and a modulus of the first protective layer are respectively equal to a thickness and a modulus of the second protective layer.

5. The display panel according to claim 1, wherein the first portion of the flexible substrate layer extends along the flat portion and the curved portion of the base substrate, the flexible substrate layer further reversely bends and extends from the first portion toward the flat portion of the base substrate beyond the curved portion of the base substrate, thereby forming the second portion and an arc-shaped portion connecting the second portion and the first portion, wherein the display panel further comprises a third protective layer on a surface of the arc-shaped portion facing away from the base substrate.

6. The display panel according to claim 1, wherein the display panel further comprises a fourth protective layer between the base substrate and the flexible substrate layer, the fourth protective layer extends along the flat portion and the curved portion of the base substrate without going beyond an end of the curved portion of the base substrate.

7. The display panel according to claim 6, wherein the display panel further comprises a light emitting layer, a polarizing layer and a cover plate on a side of the flexible substrate layer facing away from the base substrate.

8. A display device comprising the display panel according to claim 1.

9. The display device according to claim 8,
wherein the support structure comprises a support adhesive layer, the support adhesive layer is fixed to a surface of the curved portion of the base substrate facing away from the display surface of the display panel, a flat surface of the support adhesive layer facing away from the display surface of the display panel forms the support surface, and wherein the display panel further comprises a first protective layer between the support surface and the second portion of the flexible substrate layer.

10. The display device according to claim 9, wherein the support adhesive layer extends to the flat portion of the base substrate and is in contact with a portion of a surface of the flat portion facing away from the display surface of the display panel.

11. The display device according to claim 9, wherein the display panel further comprises a second protective layer on a surface of the second portion of the flexible substrate layer facing away from the support adhesive layer.

12. The display device according to claim 8, wherein the base substrate further comprises a reversely bent portion extending from the curved portion and bending towards the flat portion of the base substrate, the reversely bent portion forms the support structure, and an end of the reversely bent portion is in contact with a surface of one of the flat portion and the curved portion of the base substrate facing away from the display surface of the display panel.

13. The display device according to claim 12, wherein the display panel further comprises a first adhesive layer and a first protective layer between the second portion of the flexible substrate layer and the reversely bent portion, and the second portion of the flexible substrate layer and the first protective layer are fixed to the reversely bent portion via the first adhesive layer.

14. The display device according to claim 13, wherein the display panel further comprises a second protective layer on a surface of the second portion of the flexible substrate layer facing away from the reversely bent portion.

15. The display device according to claim 8, wherein the first portion of the flexible substrate layer extends along the flat portion and the curved portion of the base substrate, the flexible substrate layer further reversely bends and extends from the first portion toward the flat portion of the base substrate beyond the curved portion of the base substrate, thereby forming the second portion and an arc-shaped portion connecting the second portion and the first portion, and wherein the display panel further comprises a third protective layer on a surface of the arc-shaped portion facing away from the base substrate.

16. A display panel, comprising:

a base substrate; and a flexible substrate layer on the base substrate, wherein the base substrate comprises a flat portion and a curved portion extending from the flat portion and curved towards a side of the base substrate facing away from a display surface of the display panel, and the flexible substrate layer comprises a first portion on a side of the base substrate facing the display surface of the display panel and a second portion on a side of the base substrate facing away from the display surface, wherein the first portion of the flexible substrate layer comprises a pixel circuit for driving pixels of the display panel, and the second portion of the flexible substrate layer comprises a signal line electrically connected to the pixel circuit, wherein the display panel further comprises a support structure fixed to the curved portion of the base substrate, the support structure comprises a support surface facing away from the display surface of the display panel, the second portion of the flexible substrate layer is coupled to the support surface to be supported by the support surface, and a plane of the support surface intersects a plane of the flat portion of the base substrate, and wherein the base substrate further comprises a reversely bent portion extending from the curved portion and bending towards the flat portion of the base substrate, the reversely bent portion forms the support structure, and an end of the reversely bent portion is in contact with a surface of one of the flat portion and the curved portion of the base substrate facing away from the display surface of the display panel.

17. The display panel according to claim 16, wherein the display panel further comprises a first adhesive layer and a first protective layer between the second portion of the flexible substrate layer and the reversely bent portion, and the second portion of the flexible substrate layer and the first protective layer are fixed to the reversely bent portion via the first adhesive layer.

18. The display panel according to claim 17, wherein the display panel further comprises a second protective layer on a surface of the second portion of the flexible substrate layer facing away from the reversely bent portion.

* * * * *